Nov. 9, 1965 R. H. PINTELL 3,217,266

STABLE HIGH FREQUENCY AMPLIFIER

Filed March 15, 1962

ROBERT H. PINTELL
INVENTOR.

BY Karl F. Ross

AGENT

United States Patent Office 3,217,266

Patented Nov. 9, 1965

3,217,266

STABLE HIGH FREQUENCY AMPLIFIER

Robert H. Pintell, Bronx, N.Y., assignor to Intron International, Inc., Bronx, N.Y., a corporation of New York Filed Mar. 15, 1962, Ser. No. 179,865
9 Claims. (Cl. 330—77)

Figure 1:
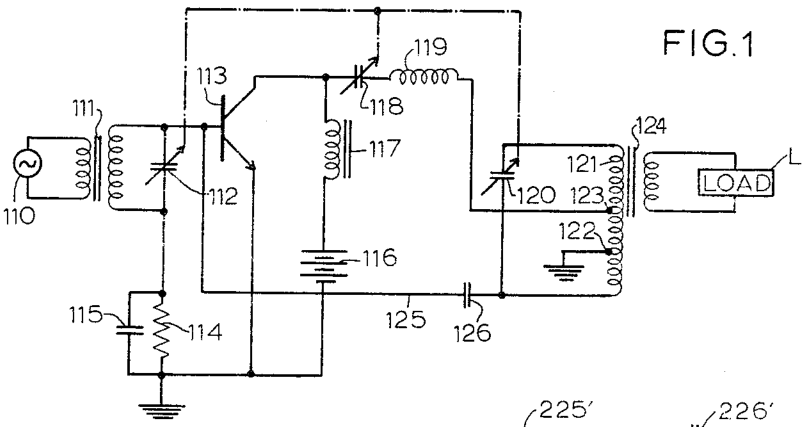

My present invention relates to a circuit arrangement for the amplification of high-frequency oscillations. This application is a continuation-in-part of my copending application Ser. No. 738,585 filed May 28, 1958, now patent No. 3,026,486 issued March 20, 1962.

The general object of this invention is to provide a very efficient amplifier system adapted to convert any periodic input signal (e.g. a pulse train or an oscillation of substantially stable frequency with a greater or less harmonics content) into a strong, purely sinusoidal wave.

The use of amplifier tubes and similar three-electrode electronic discharge devices periodically triggered into a conductive condition, at the cadence of the incoming signal, is well known. These devices act as switches, i.e. as circuit elements of alternately very high and very low resistance, when arranged to discharge into a high-Q tank circuit tuned to the fundamental frequency or cadence of the input signal, the tank circuit being so dimensioned that its voltage, under load conditions, rises rapidly above that of the direct-current supply for the associated amplifier device (or a pair of such devices connected in push-pull) whereby the discharge current through the device goes to zero substantially at the instant when the polarity of the signal applied to the control electrode of the device is changed.

The rectangular current pulse thus generated in the discharge path comprising the main electrodes of the device is filtered by the parallel-resonant tank circuit so that, generally, only the fundamental frequency is transmitted to a load coupled therewith while the higher harmonics are shunted out by the capacitive branch of this circuit.

As long as the discharge devices available for such switching operations were vacuum tubes of high internal resistance and therefore inherently low efficiency, the energy loss due to harmonic shunt currents was relatively low and therefore unobjectionable. With the advent of such improved amplifying elements as high-permeance tubes and low-resistance transistors, however, the percentage loss resulting from these shunt currents rose sharply and began to reduce the advantages of this type of system over other classes of amplifiers.

A solution to this problem, first disclosed in my aforementioned patent, lies in the inclusion of a series-resonant network in cascade with the parallel-resonant network in the discharge path of the switching device or devices, the two resonant networks being tuned to substantially the same frequency so that the former network will block the passage of the second and higher harmonics of the fundamental operating frequency which would otherwise be shunted past the load by the latter network.

The strongly resonant output circuit of an amplifier according to my present invention is conducive to the generation of spontaneous oscillations, particularly in the case of very high frequencies in which the internal capacitances of the discharge devices become effective as part of a regenerative-feedback path. Thus, it behooves in such instances to stabilize the output of the amplifier by a negative-feedback connection, in contradistinction to the positive-feedback connection provided in an oscillatory system as disclosed and claimed in my aforementioned patent. I have found, in accordance with a more particular feature of this invention, that such negative feedback can be effectively derived from the currents circulating in the parallel-resonant network via a connection coupled with a branch of that network.

In a push-pull arrangement according to the invention, stabilized as described above, the negative feedback to the alternately operative discharge devices or switching elements is advantageously obtained by cross-connections from their input electrodes to symmetrical points on the parallel-resonant network or some element coupled therewith. Under these circumstances the maintenance of a suitable balance in the output circuit of the switching elements becomes important to prevent distortions of the wave shape. Thus I prefer, by way of further improvement over the systems disclosed in my prior patent, to insert the parallel-resonant network between two substantially identical series-resonant networks whereby the symmetry of the output circuit is preserved.

Amplifiers embodying my invention have been found to operate with great efficiency, i.e. better than 80%, even at frequencies in the range of several hundred megacycles. At these high frequencies it will be convenient to constitute the several resonant networks by distributed circuit constants in the form of coaxial or two-wire resonant lines having a length equal to an integral number of quarter wavelengths, as is known per se, with the conductors of these lines directly interconnected at the network junctions.

Figure 2:
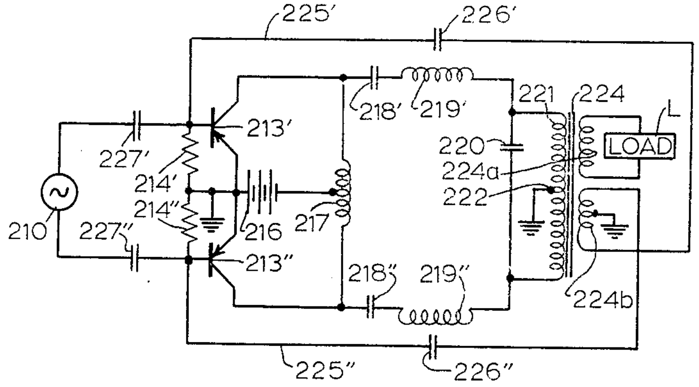
Figure 3:
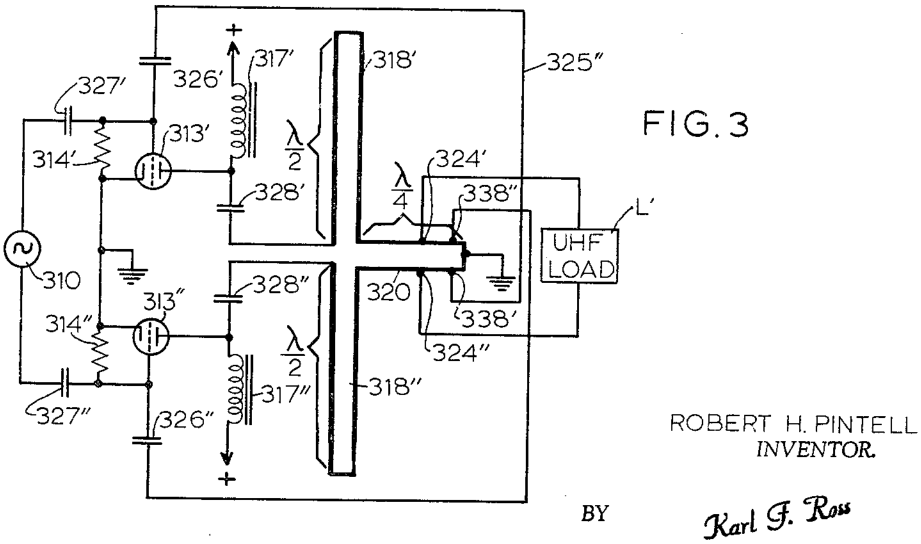

The invention will be described in greater detail with reference to the accompanying drawing in which FIGS. 1, 2 and 3 are circuit diagrams of three embodiments.

In FIG. 1 I have shown a single-ended or unbalanced system for amplifying high-frequency signals from a source 110 connected to the primary winding of an input transformer 111 whose secondary is tuned to the desired operating frequency by a parallel condenser 112. This secondary is connected between the base of an NPN-type transistor 113 with grounded emitter, acting as the switching element, and a protective resistor 114 whose other terminal is grounded and which is shunted by a condenser 115 serving as a bypass for transients. A battery 116, representative of any direct-current supply, has its negative terminal grounded and its positive terminal connected to the collector of transistor 113 by way of a choke 117 which blocks the passage of signal currents through the power supply.

The output circuit of transistor 113, extending from its collector to ground in shunt with battery 116, includes a high-Q series-resonant network, composed of a condenser 118 and an inductance 119, and in cascade therewith a high-Q parallel-resonant network, composed of a condenser 120 and an inductance 121. The latter inductance, which has a grounded tap at 122 and another intermediate point 123 (above tap 122) tied to coil 119, serves as the primary of an output transformer 124 whose secondary is connected across a load L. The secondary circuit of input transformer 111, the series-tuned network 118, 119 and the parallel-tuned network 120, 121 are all adjusted to resonate substantially the same frequency, i.e. the cadence or fundamental frequency of the signals from source 110; the three condensers 112, 118, 120 are shown ganged together for simultaneous adjustment to a different operating frequency. It will be understood that the tuning of network 120, 121 is to take into account any load reactances effectively coupled thereto.

The lower terminal of network 120, 121, whose potential varies in opposition to the polarity of the voltage on point 123 and therefore on the collector of transistor 113, is connected to the base thereof (acting as the control electrode) via a lead 125 to compensate the positive feedback via the collector-base capacitance and thus to provide negative feedback for the stabilization of the amplifier operation. Tap 122 would, of course, be so chosen that the reductive reactance present between the transistor base and ground will be sufficient to prevent any objectionable shunting of the transistor input for high-frequency currents. A condenser 126 in lead 125 blocks the passage of direct current through this feedback connection.

The transistor 113, which has a low saturation resistance, is alternately switched on and cut off by the signal applied to its base, reaching its maximum conductivity early in each positive half-cycle while remaining non-conductive during negative half-cycles.

In FIG. 2 I have shown a push-pull system according to the invention wherein the signal source 210 alternately switches on a pair of PNP-type transistors 213′, 213″ whose bases are connected to opposite terminals of that source by way of coupling condensers 227′, 227″ and to ground via resistors 214′, 214″. The collector electrodes of the transistors are energized from a battery 216 via a high-frequency choke 217, the emitter electrodes and the positive terminal of battery 216 being grounded. These collectors are also connected across an output circuit consisting of two series-resonant networks 218′, 219′ and 218″, 219″ on opposite sides of a parallel-resonant network 220, 221. Inductance coil 121, grounded at its midpoint 222, is the primary of an output transformer 224 which has a secondary *224a* for the load L and another secondary *224b* with grounded midpoint for the negative feedback. The feedback path extends from opposite terminals of secondary *224b* via respective leads 225′ and 225″, including blocking condensers 226′ and 226″, to the bases of the corresponding transistors 213′, 213″. Naturally, the same conditions as in the system of FIG. 1 prevail in the amplifier of FIG. 2 as regards the tuning of the resonant networks and the high-frequency impedance of the feedback path.

FIG. 3 illustrates another balanced amplifier system according to the invention, designed for very high or ultra-high frequencies (i.e. waves in the decimeter or centimeter range). A source 310 of UHF signals feeds, via coupling condensers 327′ and 327″, the control grids of a pair of push-pull-connected vacuum triodes 313′, 313″ connected to ground through respective grid-leak resistors 314′ and 314″. The plates of tubes 313′, 313″ are connected to the positive pole of a source of D.-C. voltage, not shown, by way of respective chokes 317′, 317″ and are further connected, with the interposition of blocking condensers 328′, 328″ of large capacitance, across an output circuit consisting substantially entirely of resonant lines. Thus, the series-resonant networks of the preceding figures have been replaced by two symmetrically positioned half-wavelength lines 318′, 318″, short-circuited at their ends to exhibit a very low input impedance, whereas the parallel-resonant network is constituted by a quarter-wavelength line 320 whose short-circuited end is grounded and whose input impedance at the operating frequency is very high. The UHF load L′ (e.g. an antenna) is connected across symmetrical points 324′, 324″ of line 320 whereas the feedback conductors 325′, 325″, again including blocking condensers 326′ and 326″, are tied to this line at points 338′, 338″ respectively disposed between taps 324″, 324′ and ground. It will be apparent that the system of FIG. 3 functions in essentially the same manner as that of FIG. 2 and that, furthermore, either system could be converted to unbalanced operation by the omission of, say, the branch including the double-primed elements thereof.

The present disclosure, according to which the series-tuned and parallel-tuned networks resonate at substantially the same frequency, is applicable to switching circuits with amplifier devices, e.g. transistors and vacuum tubes, as distinguished from breakdown-type switching devices (such as thyratrons and controlled rectifiers) which, as more fully described in my concurrently filed application Ser. No. 179,866 entitled "Sine-Wave Generator," require an output circuit with a residual capacitive reactance obtained by making the resonance frequency of the series-tuned circuit somewhat higher than that of the parallel-tuned one.

Modifications of the arrangements described and illustrated, particularly in light of the teachings of my above-identified patent, are of course possible without departing from the spirit and scope of the invention as defined in the appended claims.

I claim:

1. An amplifier for the output of a source of periodic signals, comprising a switching circuit with an electronic amplifier device having a pair of main electrodes and a control electrode, input means connecting said control electrode to said source, a supply of direct-current energy for said device connected across said main electrodes thereof, inductive reactance means in series with said supply, and an output circuit including a high-Q parallel-resonant network connected in shunt with the series combination of said supply and said reactance means for alternately turning said device on and off by impressing upon said main electrodes an overriding alternating voltage due to reactive currents circulating in said parallel-resonant network, the latter when coupled to a load being tuned to substantially the fundamental output frequency of said source, said output circuit further including a high-Q series-resonant network tuned to substantially said fundamental output frequency in cascade with said parallel-resonant network.

2. An amplifier according to claim 1, further comprising a negative-feedback coupling between said parallel-resonant network and said control electrode for stabilizing the current flow in said output circuit.

3. An amplifier for the output of a source of periodic signals, comprising a switching circuit with a pair of electronic amplifier devices each having a pair of main electrodes and a control electrode, input means connecting the control electrodes of said devices in push-pull to said source, a supply of direct-current energy for said devices connected across said main electrodes thereof, inductive reactance means in series with said supply, and an output circuit including a high-Q parallel-resonant network connected in shunt with the series combination of said supply and said reactance means between corresponding main electrodes of said devices for alternately turning each device on and off by impressing upon said main electrodes thereof an overriding alternating voltage due to reactive currents circulating in said parallel-resonant network, the latter when coupled to a load being tuned to substantially the fundamental output frequency of said source, said output circuit further including a high-Q series-resonant network tuned to substantially said fundamental output frequency in cascade with said parallel-resonant network.

4. An amplifier for the output of a source of periodic signals, comprising a switching circuit with a pair of electronic amplifier devices each having a pair of main electrodes and a control electrode, input means connecting the control electrodes of said devices in push-pull to said source, a supply of direct-current energy for said devices connected across said main electrodes thereof, inductive reactance means in series with said supply, and an output circuit including a high-Q parallel-resonant network connected in shunt with the series combination of said supply and said reactance means between corresponding main electrodes of said devices for alternately turning each device on and off by impressing upon said main electrodes thereof an overriding alternating voltage due to reactive currents circulating in said parallel-resonant network, the latter when coupled to a load being tuned to substantially the fundamental output frequency of said source, said output circuit further including two substantially identical high-Q series-resonant networks tuned to substantially said fundamental output frequency and symmetrically positioned on opposite sides of said parallel-resonant network between the latter and said device.

5. An amplifier according to claim 4, further comprising two negative-feedback leads symmetrically coupled with said parallel-resonant network and cross-connected to said control electrodes for stabilizing the current flow in said output circuit.

6. An amplifier for the output of a source of periodic signals, comprising a switching circuit with an electronic amplifier device having a pair of main electrodes and a control electrode, input means connecting said control electrode to said source, a supply of direct-current energy for said device connected across said main electrodes thereof, inductive reactance means in series with said supply, and an output circuit including a first resonant line connected in shunt with the series combination of said supply and said reactance means for alternately turning said device on and off by impressing upon said main electrodes an overriding alternating voltage due to reactive currents circulating in said first resonant line, the latter having a high input impedance at the fundamental output frequency of said source, said output circuit further including a second resonant line with a low input impedance at said fundamental output frequency in cascade with said first resonant line.

7. An amplifier for the output of a source of periodic signals, comprising a switching circuit with a pair of electronic amplifier devices each having a pair of main electrodes and a control electrode, input means connecting the control electrodes of said devices in push-pull to said source, a supply of direct-current energy for said devices connected across said main electrodes thereof, inductive reactance means in series with said supply, and an output circuit including a first resonant line connected in shunt with the series combination of said supply and said reactance means between corresponding main electrodes of said devices for alternately turning each device on and off by impressing upon said main electrodes thereof an overriding alternating voltage due to reactive currents circulating in said first resonant line, the latter having a high input impedance at the fundamental output frequency of said source, said output circuit further including a second resonant line with a low input impedance at said fundamental output frequency in cascade with said first resonant line.

8. An amplifier for the output of a source of periodic signals, comprising a switching circuit with a pair of electronic amplifier devices each having a pair of main electrodes and a control electrode, input means connecting the control electrodes of said devices in push-pull to said source, a supply of direct-current energy for said devices connected across said main electrodes thereof, inductive reactance means in series with said supply, and an output circuit including a first resonant line connected in shunt with the series combination of said supply and said reactance means between corresponding main electrodes of said devices for alternately turning each device on and off by impressing upon said main electrodes thereof an overriding alternating voltage due to reactive currents circulating in said first resonant line, the latter having a high input impedance at the fundamental output frequency of said source, said output circuit further including two substantially identical second resonant lines with a low input impedance at said fundamental output frequency and symmetrically positioned on opposite sides of said first resonant line between the latter and said devices.

9. An amplifier according to claim 8, further comprising two negative-feedback leads cross-connecting symmetrical points on said first resonant line with said control electrodes for stabilizing the current flow in said output circuit.

References Cited by the Examiner

UNITED STATES PATENTS

| | | | |
|---|---|---|---|
| 2,247,218 | 6/41 | Braaten | 330—76 X |
| 2,483,766 | 10/49 | Hansell | 330—77 X |
| 2,548,770 | 4/51 | Caraway | 330—77 X |
| 3,026,486 | 3/62 | Pintell | 331—77 X |

ROY LAKE, *Primary Examiner.*